(12) United States Patent
Levesque et al.

(10) Patent No.: US 11,878,451 B2
(45) Date of Patent: Jan. 23, 2024

(54) METHOD OF FILLING COOLING HOLES IN AN AIRFOIL COMPONENT

(71) Applicant: DYMAX, Torrington, CT (US)

(72) Inventors: Richard Levesque, Winchester, CT (US); Gregory Arcangeli, Thomaston, CT (US); Keith Plimpton, Coventry, CT (US); Eric Wilmot, Burlington, CT (US); Michael Cunningham, Torrington, CT (US); Virginia P. Hogan, Bristol, CT (US)

(73) Assignee: DYMAX, Torrington, CT (US)

( * ) Notice: Subject to any disclaimer, the term of this patent is extended or adjusted under 35 U.S.C. 154(b) by 239 days.

(21) Appl. No.: 16/797,356

(22) Filed: Feb. 21, 2020

(65) Prior Publication Data
US 2020/0353657 A1    Nov. 12, 2020

Related U.S. Application Data

(60) Provisional application No. 62/809,372, filed on Feb. 22, 2019.

(51) Int. Cl.
*C23C 16/04* (2006.01)
*B29C 45/17* (2006.01)
(Continued)

(52) U.S. Cl.
CPC ...... *B29C 45/1734* (2013.01); *B29C 45/0053* (2013.01); *B29C 45/7207* (2013.01);
(Continued)

(58) Field of Classification Search
CPC ... B29L 2031/082; C23C 4/02; C23C 14/042; C23C 16/042
See application file for complete search history.

(56) References Cited

U.S. PATENT DOCUMENTS 5,800,695 A  *  9/1998  Kang ............... C25D 5/022
                                              205/135
5,902,647 A     5/1999  Venkataramani et al.
(Continued)

FOREIGN PATENT DOCUMENTS

EP           10796106     *   2/2001
EP           1355039 A1     11/2003
(Continued)

OTHER PUBLICATIONS

International Search Report; International Application No. PCT/US2020/019156; International Filing Date: Feb. 21, 2020;dated Jun. 10, 2020; 7 pages.
(Continued)

*Primary Examiner* — Alison L Hindenlang
*Assistant Examiner* — Alexander A Wang
(74) *Attorney, Agent, or Firm* — CANTOR COLBURN LLP

(57) ABSTRACT

In an aspect, a method of filling a plurality of cooling holes in an airfoil component, the method comprises injecting a curable composition into a fill channel such that the curable composition flows through the fill channel to the plurality of cooling holes; forming a plurality of beads of the curable composition on a surface of the component over the plurality of cooling holes; directing a radiation to the respective beads in directions parallel to the respective central axes of the cooling holes associated with the respective beads to cure curable composition of the respective beads; and heating the component to cure the curable composition located in the fill channel.

16 Claims, 2 Drawing Sheets

(51) Int. Cl.
  *B29C 45/00*  (2006.01)
  *B29C 45/72*  (2006.01)
  *B29L 31/08*  (2006.01)
(52) U.S. Cl.
  CPC .... *C23C 16/042* (2013.01); *B29C 2045/0075* (2013.01); *B29L 2031/082* (2013.01)

(56) References Cited

U.S. PATENT DOCUMENTS

| | | |
|---|---|---|
| 7,192,622 B2 | 3/2007 | Fernihough et al. |
| 9,061,347 B2 | 6/2015 | Crowther et al. |
| 2016/0083829 A1* | 3/2016 | Reid ................... B05B 13/0431 427/448 |

FOREIGN PATENT DOCUMENTS

| | | |
|---|---|---|
| EP | 1387040 A1 | 2/2004 |
| EP | 3000909 A1 | 3/2016 |

OTHER PUBLICATIONS

Written Opinion; International Application No. PCT/US2020/019156; International Filing Date: Feb. 21, 2020;dated Jun. 10, 2020; 9 pages.

* cited by examiner

METHOD OF FILLING COOLING HOLES IN AN AIRFOIL COMPONENT

CROSS-REFERENCE TO RELATED APPLICATION

This application claims the benefit of U.S. Provisional Patent Application Ser. No. 62/809,372 filed Feb. 22, 2019. The related application is incorporated herein in its entirety by reference.

BACKGROUND

Airfoil components such as turbine blades and nozzle guide vanes provided in gas turbine engines often comprise cooling holes, diffusers, trailing edge cooling slots, tip cap cooling holes, platform cooling holes, which will be referred to as cooling holes, which extend from the hollow interior of the component to the exterior to provide a cooling air film when in use to cool the surface of the component. It is sometimes necessary to test the performance of such cooling holes, for example, to validate a new component design or to diagnose blockages during engine overhaul or repair. The plurality of cooling holes are often arranged in closely spaced rows along the component, and have various connections and separations of their airway passages within the body of the blade or vane. In order to test one cooling hole or a row of cooling holes, it is often necessary to selectively seal the remaining cooling holes. During repair services of the turbine blades and vanes, it is necessary to protect the integrity of the cooling holes and internal cavities from chemical and mechanical surface finishing processes. Such seals should be removable so that other cooling holes can be tested or to allow the blade to be reinstalled in an engine.

Many challenges exist in current methods of sealing the cooling holes including large amounts of material being needed, inadequate sealing of the holes, and residual sealant left on or in the airfoil component. An improved method of filling the cooling holes is therefore desired.

BRIEF SUMMARY

Disclosed herein is a method of sealing a cooling hole in an airfoil component.

In an aspect, a method of filling a plurality of cooling holes in an airfoil component comprises injecting a curable composition into a fill channel such that the curable composition flows through the fill channel to the plurality of cooling holes; forming a plurality of beads of the curable composition on a surface of the component over the plurality of cooling holes; directing a radiation to the curable composition of the plurality of beads of the plurality of cooling holes in directions parallel to the respective central axes of the cooling holes; and heating the component to cure the curable composition located in the fill channel.

In another aspect, a method of filling a plurality of cooling holes in an airfoil component comprises injecting a curable composition into a fill channel such that the curable composition flows through the fill channel to the plurality of cooling holes; forming a plurality of beads of the curable composition on a surface of the component over the plurality of cooling holes; directing a radiation to the respective beads in directions parallel to the respective central axes of the cooling holes associated with the respective beads to cure curable composition of the respective beads; and heating the component to cure the curable composition located in the fill channel.

In yet another aspect, method of filling a plurality of cooling holes in an airfoil component comprises injecting a curable composition into a fill channel such that the curable composition flows through the fill channel to the plurality of cooling holes to form a plurality of beads of the curable composition on a surface of the component over the plurality of cooling holes; filling any unconnected holes not in fluid communication with the fill channel with the curable composition; directing a radiation from a radiation source located on a multi-axis arm being positional about the component and having 6 degrees of freedom to the respective beads in directions parallel to the respective central axes of the cooling holes associated with the respective beads to cure curable composition of the respective beads; wherein the directions parallel to the respective central axes are at angles of 0 to 20°, or 0 to 15°, or 0 to 10°, or 0 to 5° of each of the central axes of the respective cooling holes; and heating the component after directing the radiation to cure the curable composition located in the fill channel.

The above described and other features are exemplified by the following figures, detailed description, and claims.

BRIEF DESCRIPTION OF THE DRAWINGS

The following figures are exemplary aspects, which are provided to illustrate the present disclosure and that are not intended to limit devices made in accordance with the disclosure to the materials, conditions, or process parameters set forth herein. For example, it is understood that figures illustrating the component, the cooling holes, the internal fill channels, and the injections holes are non-limiting illustrations and the number and configuration of the respective features can be easily reconfigured as needed or desired.

DETAILED DESCRIPTION

An improved method of filling the cooling holes of an airfoil was developed. The method can comprise injecting a curable composition into a fill channel such that the curable composition flows through the fill channel to the plurality of cooling holes. A plurality of beads of the curable composition can be formed on a surface of the component over the plurality of cooling holes. A radiation can be directed to the curable composition of the plurality of beads of the plurality of cooling holes in directions parallel to the respective central axes of the cooling holes. The component can be heated to cure the curable composition located in the fill channel.

Figure 1:
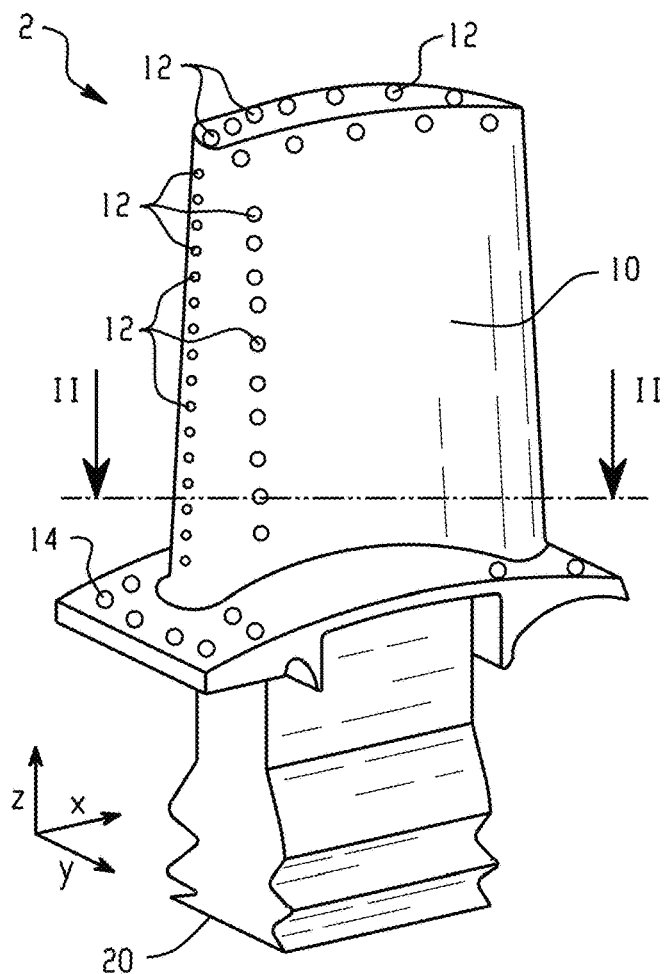
FIG. 1 is an illustration of an aspect of a component comprising cooling holes.
Figure 2:
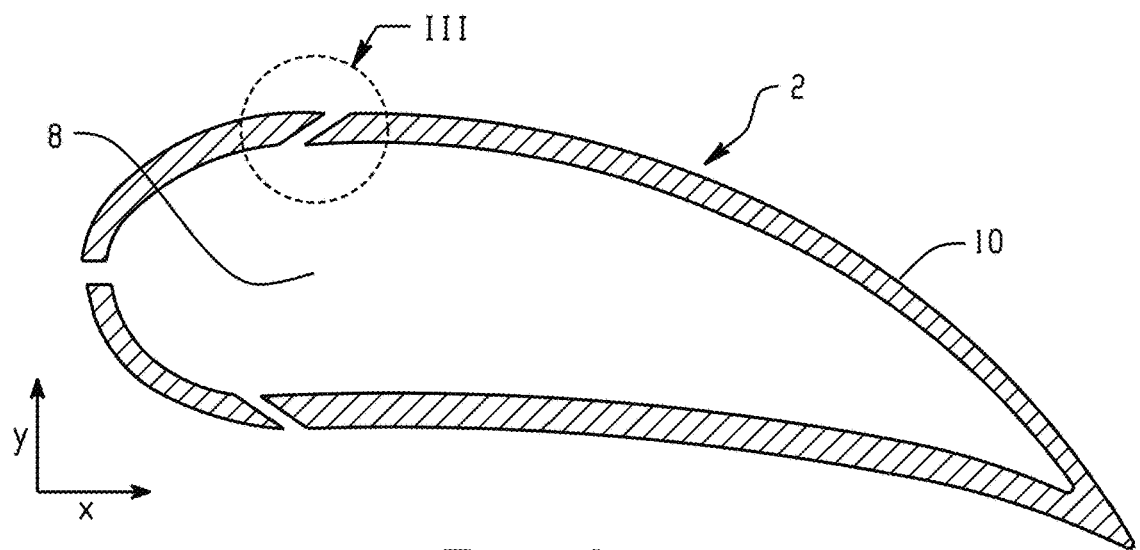
FIG. 2 is a cross-sectional illustration of an aspect of a component comprising cooling holes.

FIG. 1 to FIG. 4 are illustrations of non-limiting aspect illustrations of aspects of the component. FIG. 1 is an illustration of a component 2 comprising a plurality of cooling holes 12 located on a surface 10 of the component 2. It is noted that the cooling holes 12 can be provided in various configurations along the component 2 as is desired. FIG. 2 is an illustration of a cross-section in an x-y plane, for example, along a line II as illustrated in FIG. 1. FIG. 2 illustrates that the cooling holes 12 can traverse from the surface 10 of the component 2 to an internal area 8. Internal area 8 can be hollow.

Figure 3:
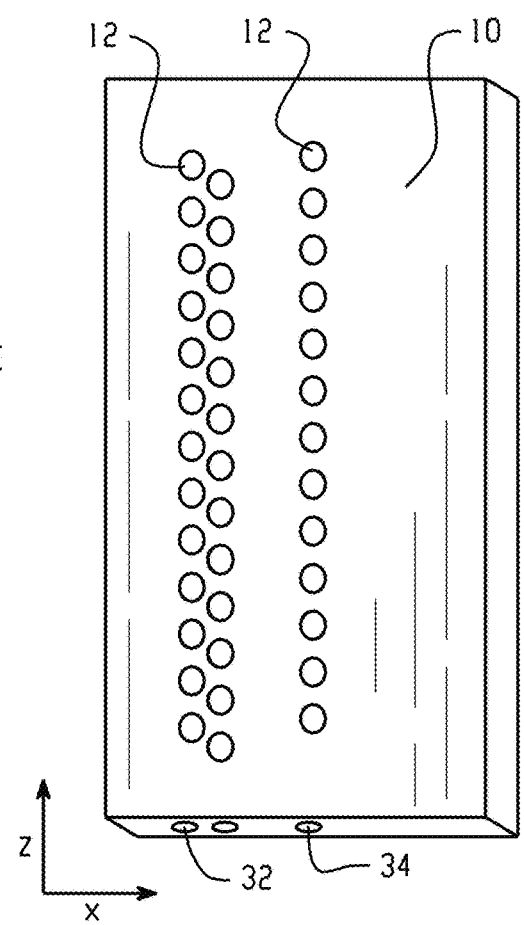
FIG. 3 is an illustration of an aspect of a portion of a component comprising cooling holes.

FIG. 3 is an illustration of a three dimensional section of surface 10 of component 2. FIG. 3 illustrates that fill channels 32, 34 can extend along a z-direction of the component 2. The plurality of cooling holes 12 can be interconnected via one or more fill channels 32, 34. The component 2 can include 1 or more, or 2 or more, or 2 to 5 fill channels. At least two of the fill channels can be in fluid communication with each other. For example, the fill channels 32, 34 can be connected to each other or, in other words, can be in fluid communication with each other along the z-axis. Conversely or additionally, at least one fill channel can be isolated and distinct from other fill channels such that it is not in fluid communication with another fill channel. For example, fill channels 32, 34 can be distinct paths from one another that are not in fluid communication with each other, where a first portion of the cooling holes 12 can be interconnected via a fill channel 32 and a second portion of the cooling holes 12 can be interconnected via a fill channel 34.

Figure 4:
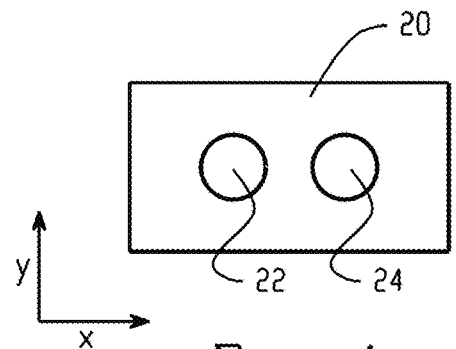
FIG. 4 is an illustration of an aspect of an injection surface of a component.

FIG. 4 illustrates that an injection surface 20 of the component 2 can comprise injection holes 22, 24. Injection hole 22 can be in fluid communication with internal fill channel 32 and injection hole 24 can be in fluid communication with internal fill channel 34. One or more fill channels and/or injection holes can be present as needed and can be dependent upon the size of the component. When installed on a gas turbine engine (not shown), cooling air can be transmitted from the injection holes 22, 24 through the fill channels 32, 34 to the cooling holes 12.

This improved method of filling the cooling holes can be used to fill the cooling holes 12 and inner cavities of a new component 2 or of a used component 2 that will be subjected to at least one of a chemical or mechanical surface treatment process. The method can comprise injecting a curable composition through one or more injection holes 22, 24 such that the curable composition flows through the fill channels 32, 34 to fill the cooling holes 12 and then selectively curing the curable composition that exits the cooling holes 12 to seal the cooling holes 12. All or only a portion of the cooling holes 12 can be filled with the curable composition.

Figure 5:
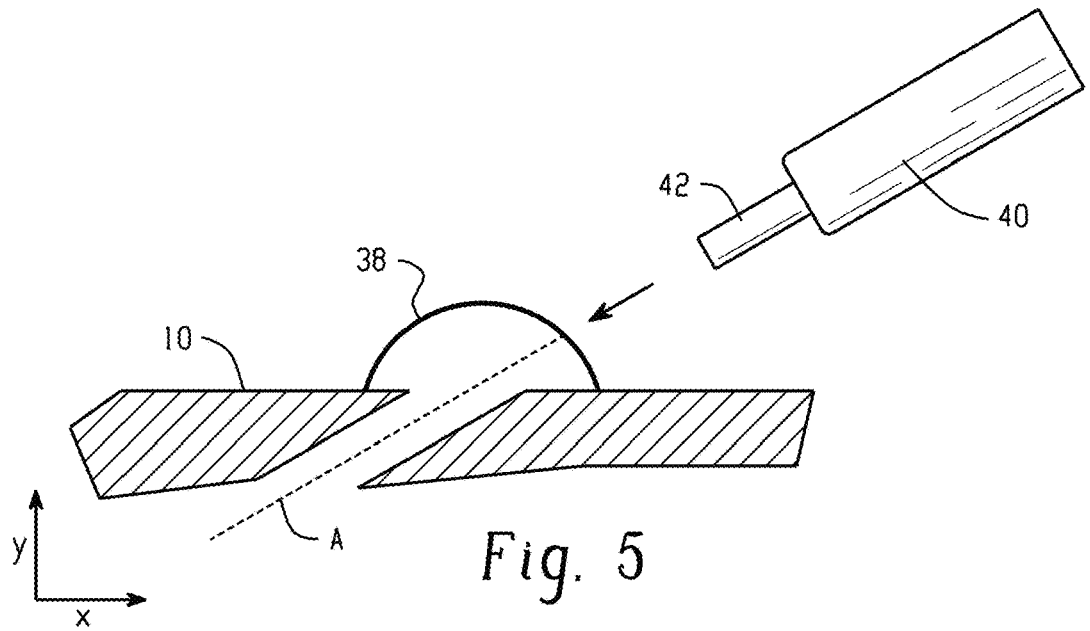
FIG. 5 is a cross-sectional illustration of an aspect of directing a radiation source to a cooling hole of a component.

The injecting can be performed via a pump, for example, a syringe pump. The injecting of the curable composition can cause the curable composition to flow through the fill channel 32, 34 to the respective cooling holes 12. FIG. 5 is an illustration of a cross-section in the x-y plane around a cooling hole 12 in area III as illustrated in FIG. 2. As the curable composition reaches the component surface 10, beads 38 can form on the component surface 10. During and/or after the time when the bead 38 is formed, a radiation source 42 can direct a radiation to the bead 38 to cure at least the curable composition in the bead and optionally within at least a portion of the cooling hole 12 to seal the cooling hole 12. As used herein, the bead 38 can be defined by an amount of the curable composition forming a convex shape outside of a cooling hole 12 on the component surface 10.

A central axis A of each of the cooling holes 12 independently can be 10 to 90°, or 25 to 90°, or 10 to 80° with respect to the surface 10, where 90° means that the central axis A is perpendicular to the surface 10. FIG. 5 illustrates that a radiation direction of an emitted radiation from the radiation source 42 can be parallel to a central axis A of the cooling hole 12, for example, at an angle of 0 to 5° with respect to the central axis A. In general, the radiation source 42 can direct a radiation towards the curable composition in each of the cooling holes 12 independently at angle of 0° to 20° relative to the central axis A, or 0 to 15°, or 0 to 10°, or 0 to 5°. FIG. 5 also illustrates that the radiation source 42 can be located along the central axis A of the cooling hole 12. For example, the radiation source 42 being located along the central axis A of the cooling hole 1 can mean at least one of the radiation source can be located on along a center axis A of the opening or a maxiumum intensity of the radiation can be along the central axis A or 90 to 100 area %, or 100 area % of the opening of the cooling hole 12 can be in the path of the radiation. It is noted that if the opening is not circular, and is, for example, ovoid, then the central axis A can refer to the central most location in the cross-section of the opening.

Directing the radiation at an angle parallel to the central axis A of the cooling hole 12 can result in a more effective curing of the curing composition within the cooling hole 12, which can increase the cure depth of the cured composition as measured from the surface 10 into the cooling hole 12. Positioning the radiation along the central axis A can further improve the cure. The radiation source 42 can be located on a multi-axis arm 40 in order to orient the radiation source 42 as needed. It is noted that the method can comprise directing radiation to the respective beads in directions parallel to and/or along the respective central axes of the cooling holes associated with the respective beads to cure curable composition of the respective beads, where the term respective refers to a specific cooling hole and the bead located thereon.

It is noted that any cooling holes not in fluid communication with the injection holes 22, 24, for example, unconnected holes 14 as illustrated in FIG. 1, can be filled by external means, for example, by depositing an amount of the curable composition in and/or on the unconnected holes 14. The curable composition in and around the unconnected holes 14 can then be cured by heating and/or by directing a radiation from the radiation source 42 to the curable composition.

Once the curable composition in the cooling holes 12 is cured, the component 2 can be heated to a cure temperature of the curable composition to cure any uncured material in the internal fill channels 32 or 34. The cure temperature can be greater than or equal to 50° C. It is noted that the heating can occur before, during, or after the curing with the radiation, or any combination thereof. In a specific aspect, the heating occurs after the curing with the radiation.

Prior to injecting the curable composition into the component 2, an orientation of a central axis A of each of the cooling holes 12 independently can be determined. In order to determine the orientations of central axes A of each of the cooling holes 12, at least one of a computer rendered illustration of the component 2 can be analyzed or a pin located at end of the multi-axis arm 40 can be inserted into each cooling hole 12 independently and its relative orientation determined. If the component 2 was previously used, determining the orientation of each cooling hole 12, or at least of cooling holes 12 subject to deformation during use can be beneficial in obtaining a more accurate mapping of the relative orientations of the cooling holes 12 of the component 2.

Figure 6:
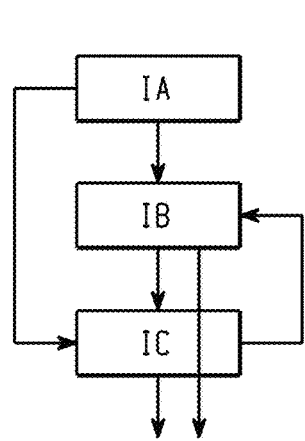
FIG. 6 is an illustration of an aspect of a method of determining the central axes of the internal fill channels.

FIG. 6 illustrates a process of mapping a surface 10 of the component 2. Step IA includes mapping a three-dimensional illustration of the component 2 in a software program. Step IB includes determining an intended central axis A for each of the cooling holes 12 based on a design of the component 2. Step IC includes measuring the central axis A of at least a portion of the cooling holes 12. FIG. 6 illustrates that one or both of Step IB or Step IC can be performed. For example, if the component 2 is new or if there is a high confidence in the central axes of the cooling holes, then only Step IB might be performed. Conversely, if there is a low confidence in the central axes of the cooling holes, then the central axes of all or of a portion of the cooling holes might be determined based on Step IC. If both Step IB and Step IC are performed, then the process can comprise measuring a central axis of a cooling hole and then updating the intended central axis of Step IB with a measured central axis measured in Step IC.

Figure 7:
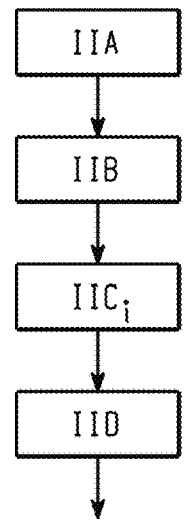
FIG. 7 is an illustration of an aspect of a method of curing the curable composition.

Once the central axes are determined, a program can be developed to move radiation source 42 via the multi-axis arm 40 to cure the curable composition exiting the cooling holes. The multi-axis arm 40 can have three or more degrees of freedom, for example, 6 degrees of freedom. FIG. 7 illustrates a process of curing the curable composition. Step IIA can include injecting the curable composition into a fill channel 32, 34 to form beads 38 on the component surface 10. Step IIB can include positioning the radiation source 42 relative to a central axis A of a cooling hole 12 and directing radiation towards the curable composition after an amount of the curable composition has formed the bead 38 on the surface 10. Step IIC can include positioning a radiation source 42 relative to a central axis A of a subsequent cooling hole 12 and directing a radiation towards the curable composition after an amount of the curable composition has formed the bead 38 on the component surface 10. Step IIC can be repeated a number of times, i, as necessary. Step IID can include heating the component 2 to cure any uncured curable composition located within the fill channels 32, 34 that was not cured via the radiation from the radiation source 42. Prior to the heating, the method can comprise removing an injection nozzle from any injection hole 22, 24 present, ensuring the injection hole 22, 24 is filled, for example, by forming a bead or beads during removal on any injection hole 22, 24 present.

The method of filling a plurality of cooling holes in an airfoil component can comprise injecting a curable composition into a fill channel such that the curable composition flows through the fill channel to the plurality of cooling holes; forming a plurality of beads of the curable composition on a surface of the component over the plurality of cooling holes; directing a radiation to the curable composition of the plurality of beads of the plurality of cooling holes in directions parallel to the respective central axes of the cooling holes; and heating the component to cure the curable composition located in the fill channel. The directing the radiation can comprise directing the radiation from a radiation source located on a multi-axis arm being positional about the component and having 6 degrees of rotation. The directions parallel to the respective central axes can be at angles of 0 to 20°, or 0 to 15°, or 0 to 10°, or 0 to 5° of each of the central axes of the respective cooling holes.

The directing the radiation on the plurality of beads can comprise forming a first bead having a convex shape on the surface of the component and then directing the radiation to the first bead. The directing the radiation on the plurality of beads can comprise forming the plurality of beads having convex shapes on the surface of the component and then directing the radiation to the bead. The directing the radiation can comprise directing a first radiation to a first bead of a first cooling hole in direction parallel to a first central axis of the first cooling hole; repositioning a multi-axis arm having the radiation source located thereon to a second central axis of a second cooling hole; directing a second radiation to a second bead located on the second cooling hole; and optionally repeating the repositioning of the multi-axis arm to subsequent beads and directing subsequent radiation towards the uncured composition of the subsequent beads. A curing path for the multi-axis arm can be determined based on the relative formation of the plurality of beads on the plurality of cooling holes. The respective central axes of the cooling holes can be determined based on at least one of a three-dimensional diagram of the component or based on a measured axis; and positioning the radiation source based on the determined central axes. The radiation can be directed via multiple multi-axis arms to respective beads comprising the uncured composition.

The injecting the curable composition can comprise injecting the curable composition into at least 2 fill channels, or 2 to 5 fill channels. At least 2 of the fill channels can be in fluid communication with each other. At least 2 of the fill channels can be isolated from each other such that they are not in fluid communication with each other.

The injecting can comprise injecting the curable composition via an injector located in an injection hole in fluid communication with the fill channel. The injector can be removed from the injection hole while injecting the curable composition, for example, while forming a final bead and the final bead can be cured. It is noted that the directing the radiation can cure the curable composition. One or more unconnected holes that are not in fluid communication with the fill channel can be filled with the curable composition. The directing the radiation on the plurality of beads can comprise forming a first bead having a convex shape on the surface of the component and then directing the radiation to the first bead. The plurality of cooling holes can be in fluid communication with the internal area. All of the plurality of cooling holes can be filled with the curable composition.

The directing the radiation can be in accordance with the curing specifications from a curable composition manufacturer's cure guidelines.

It is noted that other configurations of the radiation source are envisioned including a larger emitting bulb, or a flexible, planar source, or multiplicity of bulbs positioned around the component. In these cases, the process can comprise positioning respective radiation sources (for example, such that the radiation is parallel to the cooling holes) about the component and turning the respective radiation sources on and off as needed.

The curable composition, often referred to as a liquid maskant composition, can comprise at least one of a urethane (meth)acrylate oligomer, a reactive diluent, a photoinitiator, an optional thickening agent, or an optional additive other than the thickening agent. The curable composition can comprise the urethane (meth)acrylate oligomer and the urethane (meth)acrylate oligomer can be present in an amount of 15 to 85 weight percent, or 30 to 70 weight percent, or 40 to 60 weight percent based on a total weight of the curable composition. The curable composition can comprise the reactive diluent and the reactive diluent can be present in an amount of 20 to 60 weight percent, or 20 to 50 weight percent, or 25 to 40 weight percent based on a total weight of the curable composition. The curable composition can comprise the photoinitiator and the photoinitiator can be present in an amount of 1 to 10 weight percent, or 2 to 7 weight percent, or 3 to 5 weight percent based on a total weight of the curable composition. The curable composition can comprise the thickening agent and the thickening agent can be present in an amount of 0 to 15 weight percent, or 2 to 10 weight percent, or 2 to 6 weight percent based on a total weight of the curable composition. The curable composition can comprise the additive and the additive can be present in an amount of 0 to 5 weight percent, or 0.01 to 4 weight percent, or 0.05 to 3 weight percent based on a total weight of the curable composition.

The curable composition can be formed by mixing the respective components. The reactive (for example, polymerizable) diluent can comprise a substituted vinyl monomer with one or more functional groups. Examples of such materials include 2-hydroxyethyl (meth)acrylate, isobornyl (meth)acrylate, n-vinyl caprolactam, n,n-dimethyl acrylamide, or materials of similar compositions that are known to those skilled in the art or mixtures thereof.

The photoinitiator can comprise of any class of free radical photoinitiators, including Norrish Type I and Type II photoinitiators. Examples of Type I homolytic free-radical photoinitiators include benzoin derivatives, methylolbenzoin or 4-benzoyl-1,3-dioxolane derivatives, benzilketals, $\alpha,\alpha$-dialkoxyacetophenones, $\alpha$-hydroxy alkylphenones, $\alpha$-aminoalkylphenones, acylphosphine oxides, bisacylphosphine oxides, acylphosphine sulphides, halogenated acetophenone derivatives, or the like.

Examples of suitable Type-II (hydrogen abstraction) photoinitiators are aromatic ketones such as benzophenone, xanthone, derivatives of benzophenone (e.g. chlorobenzophenone), blends of benzophenone and benzophenone derivatives (e.g. Photocure 81, a 50/50 blend of 4-methylbenzophenone and benzophenone), Michler's Ketone, Ethyl Michler's Ketone, thioxanthone or other xanthone derivatives like Quantacure ITX (isopropyl thioxanthone), benzil, anthraquinones (e.g. 2-ethyl anthraquinone), coumarin, or the like. Chemical derivatives and combinations thereof can also be used.

The thickening agent can comprise a thixotrope known to those who are skilled in the art. These include, but are not limited to, an untreated fumed silica, a surface modified fumed silica, a polyamide thixatrope, or a mixed mineral thixotrope.

The curable composition can comprise an additional additive. The additional additive can comprise at least one of a heat stabilizer, an ultraviolet light stabilizer, a free-radical scavenger (e.g., a hindered amine light stabilizer compound), a colorant (for example, a dye or a pigment), a surfactant, a plasticizer, or an opacity-modifying agent.

The radiation can comprise at least one of ultraviolet (UV) radiation, visible light radiation, infrared radiation, an electron beam radiation, a laser, or heat.

After the curing, the beads can be removed and the component can be subjected to at least one surface treatment. After the surface treatment, the cured composition can be removed, for example, by heating above a decomposition temperature of the cured composition.

Set forth below are various non-limiting aspects of the disclosure.

Aspect 1: A method of filling a plurality of cooling holes in an airfoil component, the method comprising: injecting a curable composition into a fill channel such that the curable composition flows through the fill channel to the plurality of cooling holes; forming a plurality of beads of the curable composition on a surface of the component over the plurality of cooling holes; directing a radiation to the curable composition of the plurality of beads of the plurality of cooling holes in directions parallel to the respective central axes of the cooling holes; and heating the component to cure the curable composition located in the fill channel.

Aspect 2: The method of Aspect 1, wherein the directing the radiation comprises directing the radiation from a radiation source located on a multi-axis arm being positional about the component and having 6 degrees of rotation.

Aspect 3: The method of Aspect 2, wherein the directing the radiation comprises directing the radiation to a first bead of a first cooling hole in direction parallel to a first central axis of the first cooling hole; repositioning a multi-axis arm having the radiation source located thereon to a second central axis of a second cooling hole; directing the radiation to a second bead located on the second cooling hole; and optionally repeating the repositioning of the multi-axis arm to subsequent beads comprising the uncured composition.

Aspect 4: The method of one or more of Aspects 2 to 3, further comprising determining a curing path for the multi-axis arm based on the relative formation of the plurality of beads on the plurality of cooling holes.

Aspect 5: The method of any one or more of Aspects 2 to 4, further comprising determining respective central axes of the cooling holes based on at least one of a three-dimensional diagram of the component or based on a measured axis; and positioning the radiation source based on the determined central axes.

Aspect 6: The method of any one or more of Aspects 2 to 5, wherein the directing the radiation comprises directing multiple multi-axis arms to respective beads comprising the uncured composition.

Aspect 7: The method of any one or more of the preceding aspects, wherein directions parallel to the respective central axes are at angles of 0 to 20°, or 0 to 15°, or 0 to 10°, or 0 to 5° of each of the central axes of the respective cooling holes.

Aspect 8: The method of any one or more of the preceding aspects, wherein the injecting the curable composition comprises injecting the curable composition into at least 2 fill channels, or 2 to 5 fill channels.

Aspect 9: The method of Aspect 8, wherein at least 2 of the fill channels are in fluid communication with each other.

Aspect 10: The method of any one or more of Aspects 8 to 9, wherein at least 2 of the fill channels are not in fluid communication with each other.

Aspect 11: The method of any one or more of the preceding aspects, wherein the directing the radiation on the plurality of beads comprises forming a first bead having a convex shape on the surface of the component and then directing the radiation to the first bead.

Aspect 12: The method of any one or more of the preceding aspects, wherein the injecting comprising injecting the curable composition via an injector located in an injection hole in fluid communication with the fill channel; and wherein the method further comprises removing the injector from the injection hole while injecting or just after injecting the curable composition to form a final bead on the injection surface over the injection hole; and curing the curable composition in the final bead.

Aspect 13: The method of any one or more of the preceding aspects, further comprising filling an unconnected hole that is not in fluid communication with the fill channel with the curable composition.

Aspect 14: The method of any one or more of the preceding aspects, wherein the plurality of cooling holes are in fluid communication with the internal area.

Aspect 15: The method of any one or more of the preceding aspects, comprising filling all of the plurality of cooling holes with the curable composition.

Aspect 16: The method of any one or more of the preceding aspects, wherein the radiating comprises radiating in accordance with the curable composition manufacturer's cure guidelines.

The compositions, methods, and articles can alternatively comprise, consist of, or consist essentially of, any appropriate materials, steps, or components herein disclosed. The compositions, methods, and articles can additionally, or alternatively, be formulated so as to be devoid, or substantially free, of any materials (or species), steps, or components, that are otherwise not necessary to the achievement of the function or objectives of the compositions, methods, and articles.

The terms "a" and "an" do not denote a limitation of quantity, but rather denote the presence of at least one of the referenced item. The term "or" means "and/or" unless clearly indicated otherwise by context. Reference throughout the specification to "an aspect", "an embodiment", "another embodiment", "some embodiments", and so forth, means that a particular element (e.g., feature, structure, step, or characteristic) described in connection with the embodiment is included in at least one embodiment described herein, and may or may not be present in other embodiments. In addition, it is to be understood that the described elements may be combined in any suitable manner in the various embodiments.

The endpoints of all ranges directed to the same component or property are inclusive of the endpoints, are independently combinable, and include all intermediate points and ranges. For example, ranges of "up to 25 wt %, or 5 to 20 wt %" is inclusive of the endpoints and all intermediate values of the ranges of "5 to 25 wt %," such as 10 to 23 wt %, etc. "At least one of the foregoing" means that the list is inclusive of each element individually, as well as combinations of two or more elements of the list, and combinations of at least one element of the list with like elements not named. The term "combination" is inclusive of blends, mixtures, alloys, reaction products, and the like.

Unless defined otherwise, technical and scientific terms used herein have the same meaning as is commonly understood by one of skill in the art to which this disclosure belongs.

All cited patents, patent applications, and other references are incorporated herein by reference in their entirety. However, if a term in the present application contradicts or conflicts with a term in the incorporated reference, the term from the present application takes precedence over the conflicting term from the incorporated reference.

While particular embodiments have been described, alternatives, modifications, variations, improvements, and substantial equivalents that are or may be presently unforeseen may arise to applicants or others skilled in the art. Accordingly, the appended claims as filed and as they may be amended are intended to embrace all such alternatives, modifications variations, improvements, and substantial equivalents.

What is claimed is:

1. A method of filling a plurality of cooling holes in an airfoil component comprising an internal area surrounded by an outer wall, the method comprising:
   injecting a curable composition into a fill channel located in the outer wall such that the curable composition flows through the fill channel to the plurality of cooling holes located on a surface of the outer wall;
   forming a plurality of beads of the curable composition on the surface of the component over the plurality of cooling holes such that a single bead is formed on each of the plurality of cooling holes;
   directing a radiation to the respective beads in directions parallel to the respective central axes of the cooling holes associated with the respective beads to cure curable composition of the respective beads; and
   heating the component to cure the curable composition located in the fill channel; wherein the heating of the component is conducted after the directing of the radiation to the beads; wherein the injecting comprises injecting the curable composition via an injector located in an injection hole in fluid communication with the fill channel; and wherein the method further comprises removing the injector from the injection hole while injecting the curable composition to form a final bead on the injection surface over the injection hole; and curing the curable composition in the final bead.

2. The method of claim 1, wherein the directing the radiation comprises directing the radiation from a radiation source located on a multi-axis arm being positional about the component and having 6 degrees of freedom.

3. The method of claim 2, wherein the directing the radiation comprises directing a first radiation to a first bead of a first cooling hole in direction parallel to a first central axis of the first cooling hole; repositioning a multi-axis arm having the radiation source located thereon to a second central axis of a second cooling hole; directing a second radiation to a second bead located on the second cooling hole; and optionally repeating the repositioning of the multi-axis arm to subsequent beads comprising the uncured composition.

4. The method of claim 2, further comprising determining a curing path for the multi-axis arm based on the relative formation of the plurality of beads on the plurality of cooling holes.

5. The method of claim 2, further comprising determining respective central axes of the cooling holes based on at least one of a three-dimensional diagram of the component or based on a measured axis; and positioning the radiation source based on the determined central axes.

6. The method of claim 2, wherein the directing the radiation comprises directing multiple multi-axis arms to respective beads comprising the uncured composition.

7. The method of claim 1, wherein directions parallel to the respective central axes are at angles of 0 to 20° of each of the central axes of the respective cooling holes.

8. The method of claim 1, wherein the injecting the curable composition comprises injecting the curable composition into at least 2 fill channels.

9. The method of claim 8, wherein at least 2 of the fill channels are in fluid communication with each other.

10. The method of claim 8, wherein at least 2 of the fill channels are not in fluid communication with each other.

11. The method of claim 1, wherein the directing the radiation on the plurality of beads comprises forming a first bead having a convex shape on the surface of the component and then directing the radiation to the first bead.

12. The method of claim 1, further comprising filling an unconnected hole that is not in fluid communication with the fill channel with the curable composition.

13. The method of claim 1, wherein the plurality of cooling holes are in fluid communication with the internal area.

14. The method of claim 1, comprising filling all of the plurality of cooling holes with the curable composition.

15. The method of claim 1, wherein the heating the component occurs after directing the radiation to cure the curable composition located in the fill channel.

16. A method of filling a plurality of cooling holes in an airfoil component comprising an internal area surrounded by an outer wall, the method comprising:
- injecting a curable composition into a fill channel located in the outer wall such that the curable composition flows through the fill channel to the plurality of cooling holes located on a surface of the outer wall to form a plurality of beads of the curable composition on the surface of the outer wall over the plurality of cooling holes such that a single bead is formed on each of the plurality of cooling holes;
- filling any unconnected holes not in fluid communication with the fill channel with the curable composition;
- directing a radiation from a radiation source located on a multi-axis arm being positional about the component and having 6 degrees of freedom to the respective beads in directions parallel to the respective central axes of the cooling holes associated with the respective beads to cure curable composition of the respective beads; wherein the directions parallel to the respective central axes are at angles of 0 to 20° of each of the central axes of the respective cooling holes; and
- heating the component after directing the radiation to cure the curable composition located in the fill channel; wherein the heating of the component is conducted after the directing of the radiation to the beads; wherein the injecting comprises injecting the curable composition via an injector located in an injection hole in fluid communication with the fill channel; and wherein the method further comprises removing the injector from the injection hole while injecting the curable composition to form a final bead on the injection surface over the injection hole; and curing the curable composition in the final bead.

* * * * *